(12) United States Patent
Tsujita

(10) Patent No.: US 7,049,994 B2
(45) Date of Patent: May 23, 2006

(54) SEMICONDUCTOR INTEGRATED CIRCUIT

(75) Inventor: Tatsuo Tsujita, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 107 days.

(21) Appl. No.: 10/508,795

(22) PCT Filed: Mar. 18, 2003

(86) PCT No.: PCT/JP03/03240

§ 371 (c)(1),
(2), (4) Date: Sep. 21, 2004

(87) PCT Pub. No.: WO03/081781

PCT Pub. Date: Oct. 2, 2003

(65) Prior Publication Data

US 2005/0068217 A1    Mar. 31, 2005

(30) Foreign Application Priority Data

Mar. 22, 2002    (JP) .............................. 2002-079960

(51) Int. Cl.
*H03M 1/38*    (2006.01)
(52) U.S. Cl. ...................... 341/161; 341/155
(58) Field of Classification Search ................ 341/143, 341/118, 120, 144, 155, 172, 161; 345/213, 345/611; 348/536, 537
See application file for complete search history.

(56) References Cited

U.S. PATENT DOCUMENTS

| | | | |
|---|---|---|---|
| 5,764,299 A | 6/1998 | Jennes et al. | |
| 5,995,031 A | 11/1999 | Okuda et al. | |
| 6,160,508 A * | 12/2000 | Gustavsson et al. | ........ 341/155 |
| 6,392,575 B1 * | 5/2002 | Eklund | ....................... 341/141 |
| 6,518,905 B1 * | 2/2003 | Siferd | ........................ 341/143 |
| 6,771,203 B1 * | 8/2004 | Nairn | ........................ 341/159 |

(Continued)

FOREIGN PATENT DOCUMENTS

EP    0 457 329 A    11/1991

(Continued)

OTHER PUBLICATIONS

Huawen Jin et al; Time-interleaved A/D converter with channel randomization; Circuits and Systems, 1997. ISCAS '97., Proceedings of 1997 IEEE International Symposium on Hong Kong Jun. 9-12, 1997, New York, NY, USA, IEEE US vol. 1, Jun. 9, 1997, p. 425-428.

(Continued)

*Primary Examiner*—Brian Young
(74) *Attorney, Agent, or Firm*—Sughrue Mion, PLLC

(57) ABSTRACT

A semiconductor integrated circuit including a plurality of ADCs subjected to interleave-operation in parallel, or a semiconductor integrated circuit including an imaging ADC using a plurality of circuit elements to be switched sequentially, in which even when an image signal of any specification is input, an output signal of the plurality of ADCs or the imaging ADC is averaged to reduce irregularities on a screen. The semiconductor integrated circuit includes a plurality of analog/digital converting circuits (11) operated in parallel for sequentially converting an analog image signal to a digital image signal, a multi-phase clock signal generating circuit (12) for generating multi-phase clock signals to be used for periodically operating the plurality of analog/digital converting circuits (11) in a certain order, and a control circuit (20) for controlling the multi-phase clock signal generating circuit (12) to change a period or an order of operating the plurality of analog/digital converting circuits (11).

15 Claims, 13 Drawing Sheets

U.S. PATENT DOCUMENTS

| | | | |
|---|---|---|---|
| 6,788,240 B1 * | 9/2004 | Reyneri et al. ............ | 341/159 |
| 2001/0052864 A1 | 12/2001 | Shimizu et al. | |

FOREIGN PATENT DOCUMENTS

| EP | 1 043 839 A | 10/2000 |
|---|---|---|
| EP | 1 058 234 A | 12/2000 |
| JP | 63 121385 A | 5/1988 |
| JP | 3-46883 A | 3/1991 |
| JP | 05 110992 A | 4/1993 |
| JP | 11-31969 A | 2/1999 |
| WO | 97/20304 A | 5/1997 |

OTHER PUBLICATIONS

Petraglia A. et al., Effects of quantization noise in parallel arrays of analog-to-digital converters; Circuits and Systems, ISCAS '94., 1994 IEEE International Symposium on London, UK May 30-Jun. 2, 1994; New York, NY. USA, IEEE, US vol. 5, May 30, 1994; p. 337-340.

* cited by examiner

SEMICONDUCTOR INTEGRATED CIRCUIT

This application is a 371 of PCT/JP03/03240 filed Mar. 18, 2003.

TECHNICAL FIELD

The present invention relates generally to semiconductor integrated circuits, and more particularly to a semiconductor integrated circuit including an imaging ADC (analog to digital converter) for converting an analog image signal to a digital image signal.

BACKGROUND ART

In these years, the resolution of a digital image display device such as LCD (liquid crystal display) or PDP (plasma display panel) has been improved in recent years. The operating speed of an LSI (large scale integration) for converting an analog image signal to a digital image signal has correspondingly been increased. For operating an LSI at a high speed, the circuit is usually designed to use finer transistors having a smaller stray capacitance and a higher current driving force. With respect to a part of the LSI which cannot be easily made operate at a high-speed, a technique for operating a plurality of circuits having the identical function in parallel is employed to obtain substantial high-speed operation.

Even in an imaging ADC for supplying a digital image signal to a digital image display device, as in the above case, an advanced processing technology is used to widen a bandwidth, and the parallel operation based on interleave operation is used. However, there are variations in characteristics among a plurality of ADCs for performing parallel operation due to the limitation of a micro-machining technology. This results in deteriorated characteristics, for example, generation of a differential linearity error or an integral linearity error.

FIG. 12 shows an exemplary configuration of a prior art imaging ADC. The imaging ADC 110 has first to N-th ADCs 111 for performing parallel operation, a multi-phase clock signal generating circuit 112 for supplying multi-phase clock signals to the ADCs 111, and a selector circuit 113 for selecting one of output signals of the ADCs 111. The first to N-th ADCs 111 sequentially convert an analog signal to a digital signal in synchronism with the multi-phase clock signals received from the multi-phase clock signal generating circuit 112. In this example, reference symbol N denotes a degree of parallelism of the ADCs.

In general, in an image signal, as shown in FIG. 13, pixel information corresponding to one line continues from the upper left of the screen to the horizontal direction, and then under the line by one pixel in the vertical direction, pixel information corresponding to another line also continues from the left side of the screen to the horizontal direction. The repetition of the above-mentioned pixel information forms an image signal corresponding to one frame. A number of pixels in one frame, that is, a sampling number of times M in one frame can be obtained from a product of a number of pixels in one line and a number of lines in one frame.

Assume that the sampling number of times M in one frame is divisible by the degree N of parallelism of ADCs, and that the first ADC samples a pixel P (I, 1), the second ADC samples a pixel P (I, 2), and the N-th ADC samples a pixel P (I, N) in a frame (I). Then, even in a frame (I+1), the first ADC samples a pixel P (I+1, 1), the second ADC samples a pixel P (I+1, 2), and the N-th ADC samples a pixel P (I+1, N), in a similar manner. In this case, P (I, J) denotes a J-th pixel in an I-th frame. In such a case, if the first to N-th ADCs vary in characteristics, even when an identical analog signal is inputted to the ADCs, a constant pattern of error occurs in an output digital signal, which results in appearance of irregularities on the display screen.

For the purpose of suppressing the influences of variations in circuit elements including a resistor and a capacitor upon analog/digital conversion characteristics during conversion from an analog image signal to a digital image signal by using a single ADC, output results of the ADC are averaged by sequentially switching (swapping) between a plurality of circuit elements. Even in such a case, with respect to pixels for a plurality of successive frames, if a plurality of circuit elements in the ADC are arranged in the same cycle or sequence, irregularities appear on the screen.

For the purpose of reducing irregularities on the screen caused by such variations, it is also considered to digitally correct the output signal of the imaging ADC. However, such digital correction requires complicated circuit and processing.

DISCLOSURE OF THE INVENTION

In view of the above respects, in a semiconductor integrated circuit including a plurality of parallel interleave-operating ADCs or an imaging ADC for sequentially switching between a plurality of circuit elements, it is an object of the present invention to reduce irregularities on a display screen by averaging output signals of one or more imaging ADC to reduce irregularities on a screen.

In order to resolve the above-mentioned object, a semiconductor integrated circuit according to a first aspect of the present invention comprises a plurality of analog/digital converting circuits operated in parallel for sequentially converting an analog image signal to a digital image signal, a multi-phase clock signal generating circuit for generating multi-phase clock signals to be used for periodically operating the plurality of analog/digital converting circuits in a certain order, and a control circuit for controlling the multi-phase clock signal generating circuit to change at least one of a period and an order of operating the plurality of analog/digital converting circuits.

Further, a semiconductor integrated circuit according to a second aspect of the present invention comprises an analog/digital converting circuit for converting an analog image signal to a digital image signal by sequentially switching between a plurality of circuit elements, a first control circuit for controlling the analog/digital converting circuit to periodically arrange the plurality of circuit elements in a certain order, and a second control circuit for controlling the first control circuit to change at least one of a period and an order of arranging the plurality of circuit elements.

According to the present invention arranged as mentioned above, in the case where the plurality of analog/digital converting circuits are operated in parallel, the period or order of operating these analog/digital converting circuits is changed. Also, in the case where the single analog/digital converting circuit is used by sequentially switching between the plurality of circuit elements, the period or order of arranging these circuit elements is changed. In this way, even when an image signal of any specification is inputted, the output signal of the imaging ADC is averaged and irregularities on the screen can be reduced.

BRIEF DESCRIPTION OF THE DRAWINGS

The advantages and features of the present invention will be more clearly understood with respect to the detailed description and drawings, in which constituent elements having the same functions are denoted by the same reference numerals or symbols.

BEST MODE FOR CARRYING OUT THE INVENTION

Firstly, there will be described a first embodiment of the present invention.

Figure 1:
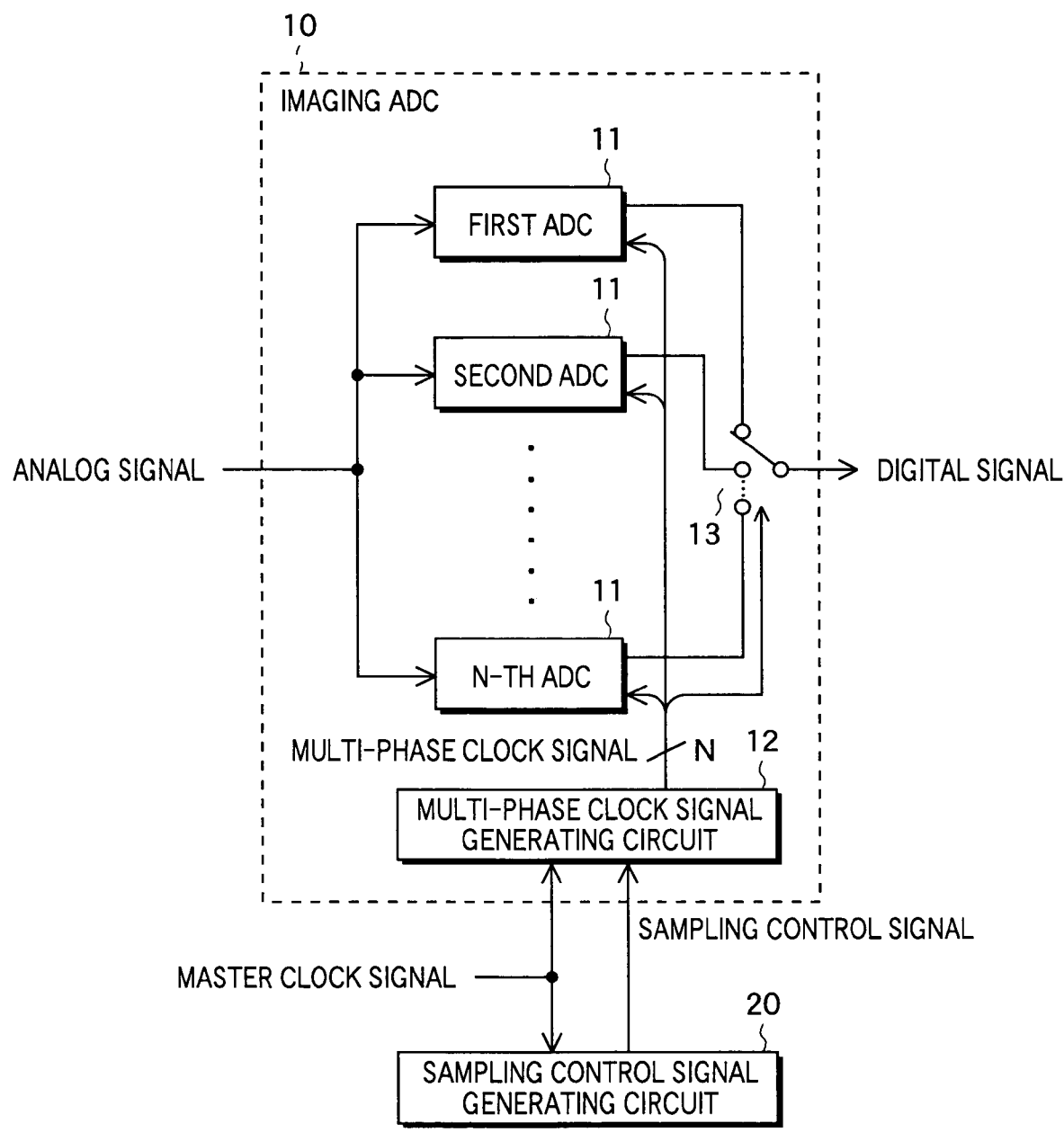
FIG. 1 is a block diagram showing a configuration of a semiconductor integrated circuit according to a first embodiment of the present invention.

FIG. 1 is a block diagram showing a configuration of a semiconductor integrated circuit according to a first embodiment of the present invention. As shown in FIG. 1, the semiconductor integrated circuit includes an imaging ADC 10 and a sampling control signal generating circuit 20. The imaging ADC 10 has first to N-th ADCs 11 for performing parallel operation, a multi-phase clock signal generating circuit 12 for generating multi-phase clock signals to be used for operating these ADCs 11 periodically in a certain order, and a selector circuit 13 for selecting one of output signals of the ADCs 11.

The sampling control signal generating circuit 20 outputs a sampling control signal on the basis of a master clock signal. In the imaging ADC 10, the multi-phase clock signal generating circuit 12 generates the multi-phase clock signals on the basis of the master clock signal and the sampling control signal received from the sampling control signal generating circuit 20, and supplies the multi-phase clock signals to the respective ADCs 11. The first to N-th ADCs 11 converts an input analog signal to a digital signal in synchronism with the multi-phase clock signals generated by the multi-phase clock signal generating circuit 12, and outputs the converted digital signal. The selector circuit 13 selects one of the digital signals outputted from the ADCs 11 in accordance with the multi-phase clock signals, and then outputs the selected digital signal.

Figure 2:
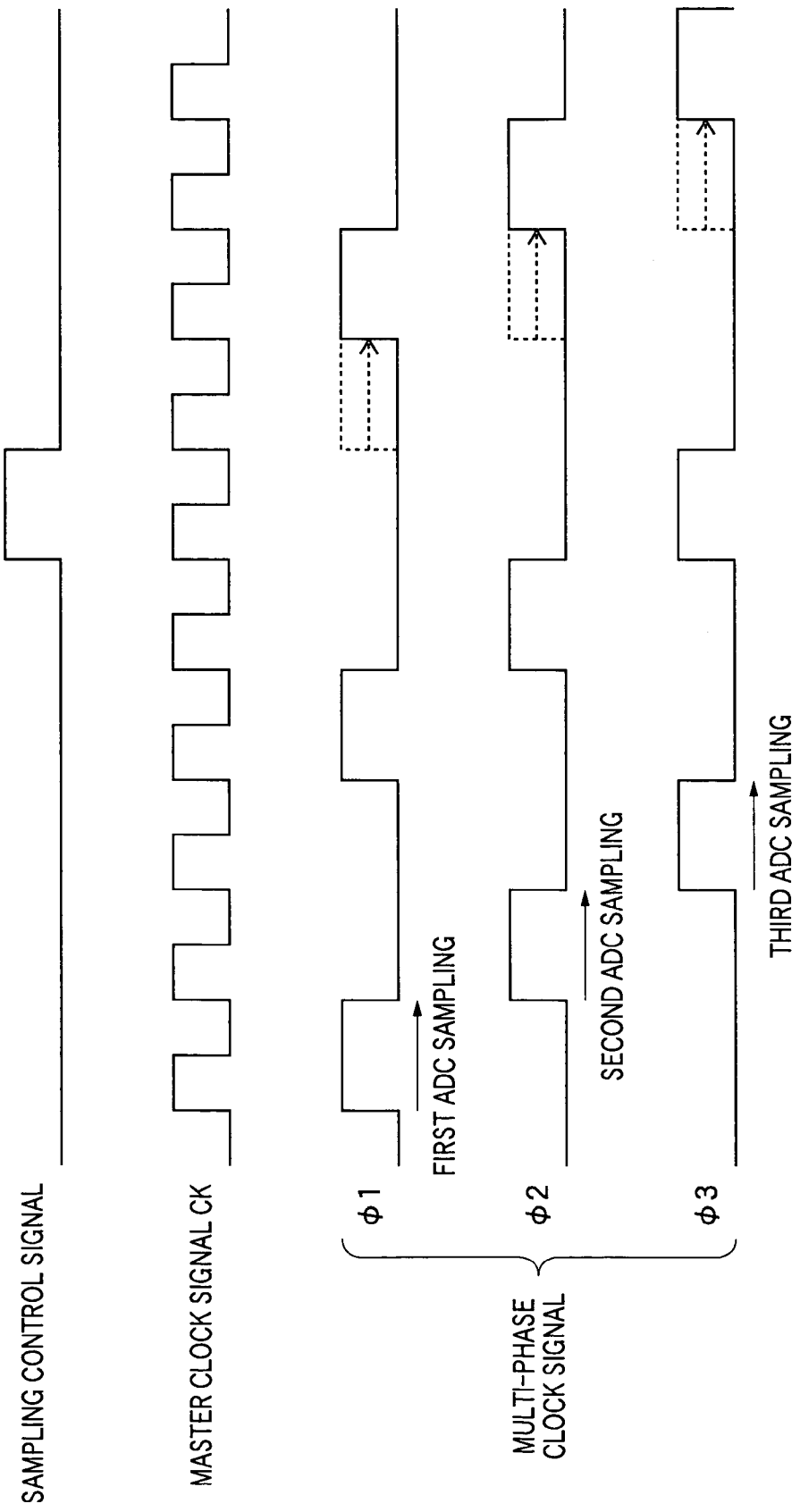
FIG. 2 is a timing chart showing waveforms of signals appearing at various points in an imaging ADC as shown in FIG. 1.

FIG. 2 is a timing chart showing waveforms of signals appearing at various points in the case where N=3 in the imaging ADC 10 shown in FIG. 1. On the basis of the master clock signal and the sampling control signal, the multi-phase clock signal generating circuit 12 generates multi-phase clock signals $\Phi 1$, $\Phi 2$ and $\Phi 3$ to be used for cyclically operating the first, second and third ADCs.

Now assume that a sampling number of times in one frame is represented by M where M=(a number of pixels in one line)×(a number of lines in one frame) and M is a multiple of 3. Then each of the ADCs samples the same pixel on the screen in a plurality of frames. As a result, irregularities corresponding to variations among the ADCs appear on the screen. In the present embodiment, for the purpose of preventing the above-mentioned irregularities appearance, the sampling timing of the ADCs are shifted, for example, in a blanking period of an image signal. As a result, even when an image signal of any specification is input, irregularities on the screen can be reduced.

As shown in FIG. 1, the semiconductor integrated circuit according to the present embodiment includes the sampling control signal generating circuit 20 for generating the sampling control signal to be used for shifting the sampling timing in a predetermined state. On the basis of the sampling control signal, the multi-phase clock signal generating circuit 12 shifts phases of the multi-phase clock signals to be generated.

As shown in FIG. 2, when the sampling control signal is changed to its high level, the multi-phase clock signal generating circuit 12 shifts the phases of the multi-phase clock signals to be generated by an amount corresponding to at least one pulse of a master clock signal CK. As a result, the ADCs are operated at timing shifted by at least one pulse of the master clock signal CK, so as to prevent the same ADC from sampling the same pixel on the screen in successive two frames.

Figure 3:
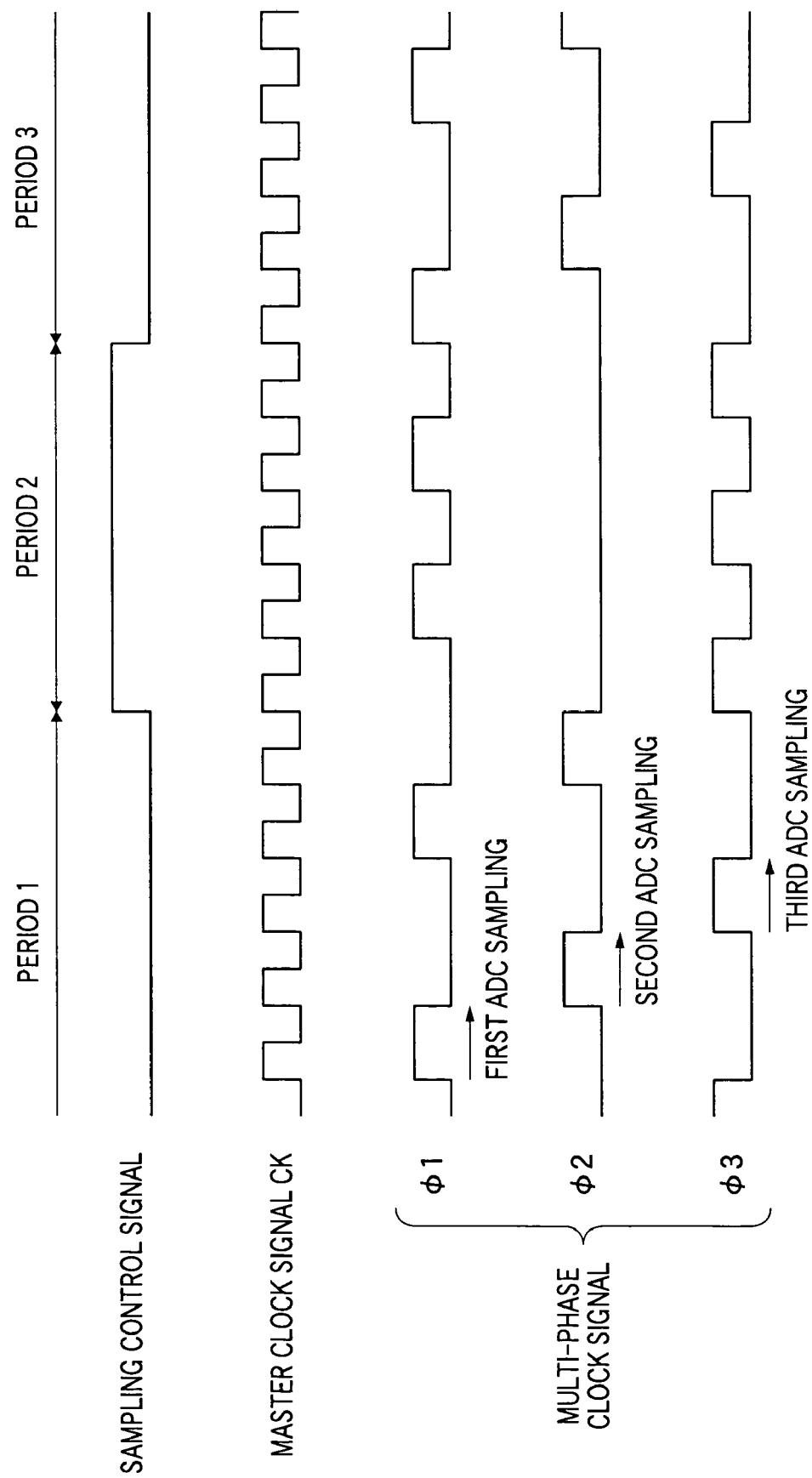
FIG. 3 is another timing chart showing waveforms of signals at various points in the imaging ADC as shown in FIG. 1.

FIG. 3 is a timing chart showing waveforms of signals appearing at various points when a sampling period is varied in the case where N=3 in the imaging ADC 10 shown in FIG. 1. On the basis of the master clock signal and the sampling control signal, the multi-phase clock signal generating circuit 12 generates multi-phase clock signals $\Phi 1$, $\Phi 2$ and $\Phi 3$ to be used for cyclically operating the first, second and third ADCs. The period of cyclically operating the first, second and third ADCs is controlled by the sampling control signal.

When the period of cyclically operating the first, second and third ADCs is varied for every frame, all pixels are prevented from being sampled always by the same ADC and irregularities on the screen are averaged on a time basis, which results in that the irregularities cannot be visually recognized.

Hereinafter, there will be described a sampling control method used in the present embodiment. It is assumed in the following explanation that a sampling number of times in one frame, that is, (the number of pixels in one line)×(the number of lines in one frame) is denoted by M and that a degree of parallelism of ADCs, that is, the number of ADCs operated in parallel is denoted by N, where each of M and N is an integer equal to or larger than 2. It is also assumed that a remainder when M is divided by N is denoted by K (K=M mod N).

A first sampling control method will be explained. In the case where K=0, by obtaining such L satisfying a requirement that a remainder when (M+L) is divided by N is not zero, the sampling timing is shifted by an amount corresponding to L pulses of the master clock signal in one frame. Accordingly, the same parallel-operating ADCs can be prevented from sampling pixels at the same positions at least in successive two frames. As a result, when the number of parallel-operating ADCs is two or more, the averaging effect by at least two ADCs can be obtained.

Next, there will be described a second sampling control method. In the case where K=0 or in the case where K≠1 and N is divisible by K (N mod K=0), by obtaining such L that N and J (J≠0) are mutually primes where J represents a remainder when (M+L) is divided by N (J=(M+L) mod N), the sampling timing is shifted by an amount corresponding to L pulses of the master clock signal in one frame. For example, when M=1688 and N=8, L satisfying this conditions is 1, 3, 5 or 7. In this manner, when the number of parallel-operating ADCs is N, the averaging effect by N ADCs can be achieved.

Next, there will be described a third sampling control method. A pseudorandom number generating circuit for generating an integer within a range from zero to (N−1) is prepared. When the pseudorandom number generating circuit has an output L(i) for an i-th frame, the sampling timing is shifted by an amount corresponding to L(i) pulses of the master clock signal in this frame. When the pseudorandom number generating circuit has an output L(i+1) for the next (i+1)-th frame, the sampling timing is shifted by an amount corresponding to L(i+1) pulses of the master clock signal in the next frame.

In this manner, the sampling order of the parallel ADCs for sampling the same pixel can be made non-uniform on a time base at least within the period of the pseudorandom numbers. Thus unlike the aforementioned first and second sampling control methods, substantially non-uniform averaging effect can be obtained.

Next, there will be described a first modification of the semiconductor integrated circuit according to the present embodiment, by referring to FIGS. 4 and 5.

Figure 4:
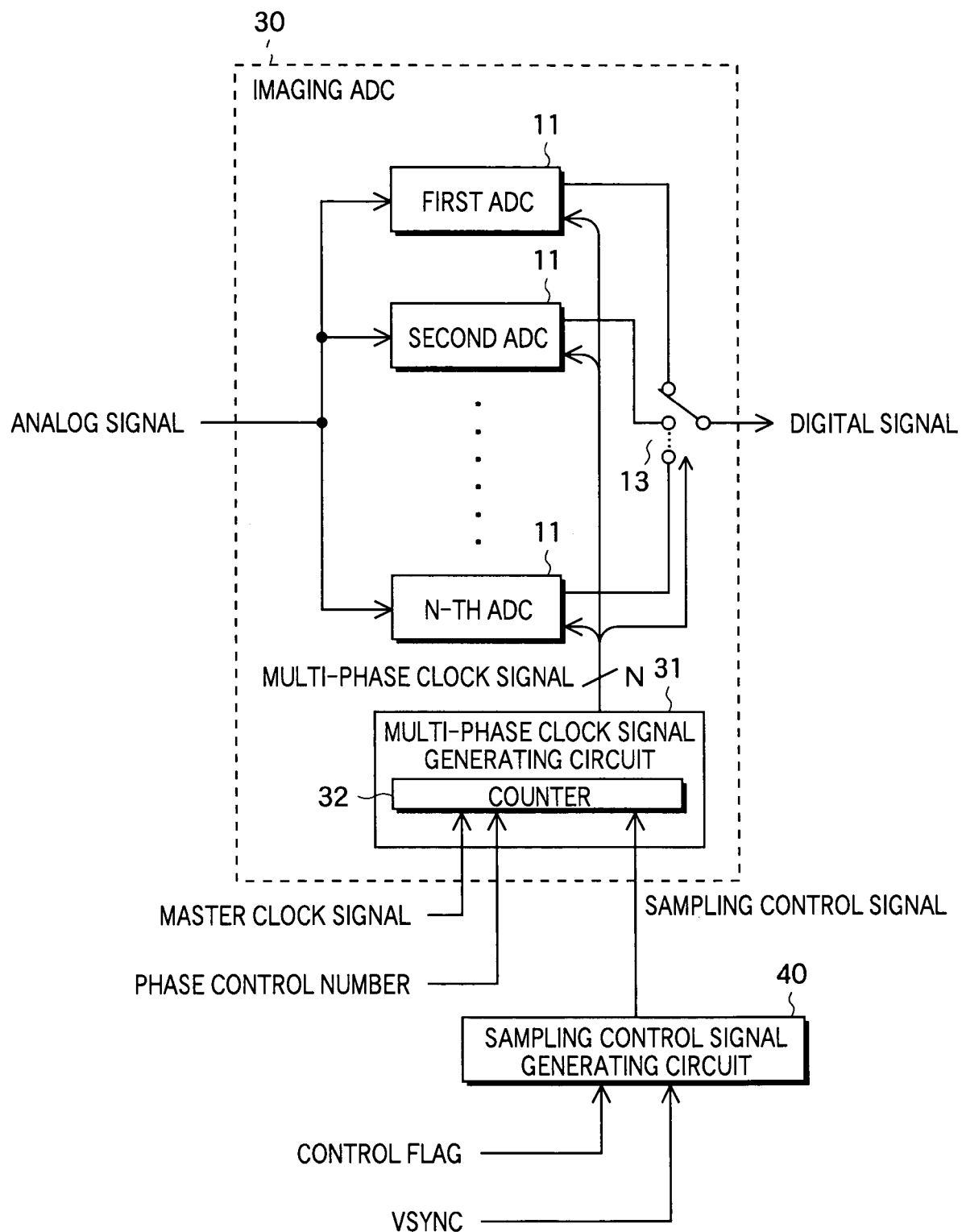
FIG. 4 is a block diagram showing a configuration of a first modification of the semiconductor integrated circuit according to the first embodiment of the present invention.

As shown in FIG. 4, the semiconductor integrated circuit includes an imaging ADC 30 and a sampling control signal generating circuit 40. The imaging ADC 30 has first to N-th ADCs 11, a multi-phase clock signal generating circuit 31 for generating multi-phase clock signals which define sampling timing of these ADCs 11, and a selector circuit 13 for selecting one of output signals of the ADCs 11. The multi-phase clock signal generating circuit 31, which has a counter 32 provided therein, generates multi-phase clock signals on the basis of the master clock signal, a phase control number and a sampling control signal.

The sampling control signal generating circuit 40 generates the sampling control signal on the basis of a control flag and a vertical synchronization signal VSYNC. More specifically, when the control flag is set, the sampling control signal generating circuit 40 generates the sampling control signal by using a transition edge of the vertical synchronization signal VSYNC as a reference, and supplies the sampling control signal to the imaging ADC 30. In this connection, as well as the vertical synchronization signal VSYNC, a horizontal synchronization signal HSYNC or another signal synchronized with the vertical synchronization signal VSYNC or with the horizontal synchronization signal HSYNC may be used.

In the imaging ADC 30, the counter 32 provided in the multi-phase clock signal generating circuit 31 counts the master clock signal, and stores states for generation of the multi-phase clock signals as counter values. The counter 32, in response to the sampling control signal, changes its counter value by a number set as the phase control number. This causes the multi-phase clock signal generating circuit 31 to change the phases of the multi-phase clock signals.

Figure 5:
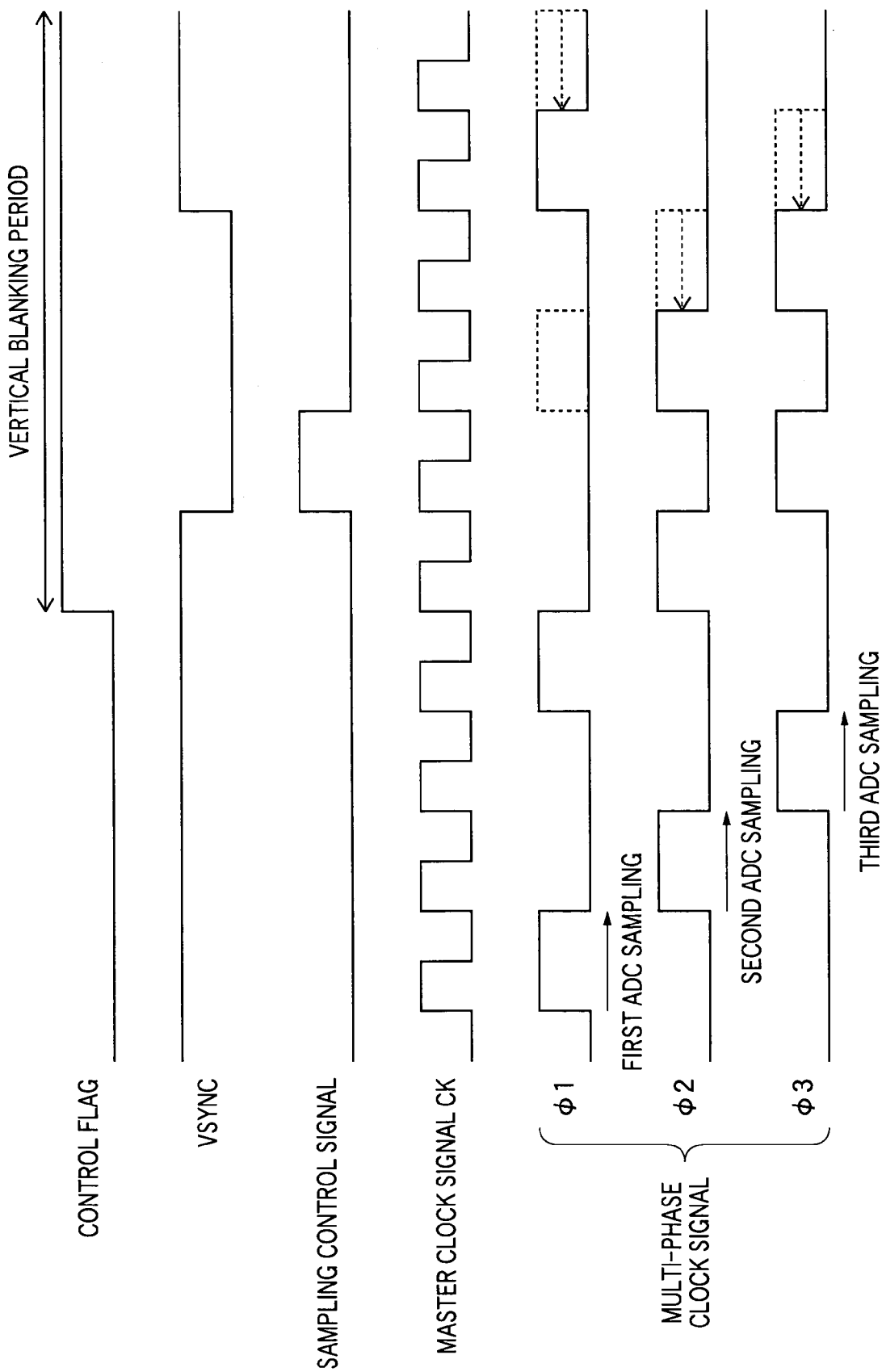
FIG. 5 is a timing chart showing waveforms of signals at various points in an imaging ADC as shown in FIG. 4.

FIG. 5 is a timing chart showing waveforms of signals appearing at various points in the imaging ADC 30 shown in FIG. 4 in the case where N=3. When the edge of the vertical synchronization signal VSYNC is transited while the control flag is set in a vertical blanking period or the like, the sampling control signal generating circuit 40 changes the sampling control signal to its high level. In the imaging ADC 30, the counter 32 in the multi-phase clock signal generating circuit 31 counts the master clock signal CK, and when the sampling control signal is changed to high level, the counter changes its counter value by a number set as the phase control number. As a result, the phases of the multi-phase clock signals Φ1, Φ2 and Φ3 vary as shown in FIG. 5. In FIG. 5, the phase control number is set at "1".

In this example, a total sampling number of times is not changed, and therefore, given a timing margin, sampling control can be possible even in a period other than the blanking period.

Next, a second-modification of the semiconductor integrated circuit according to the present embodiment will be described by referring to FIGS. 6 and 7.

Figure 6:
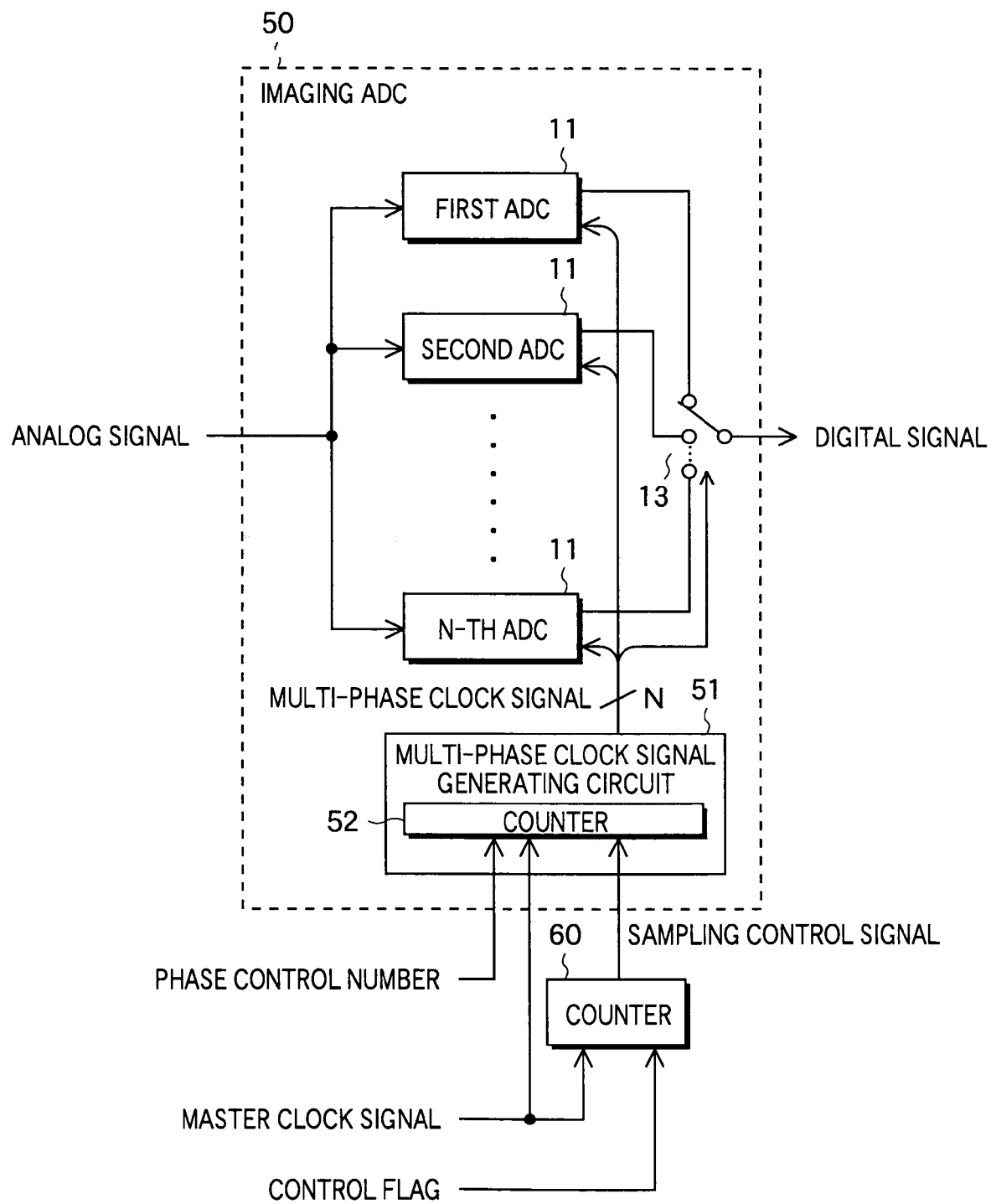
FIG. 6 is a block diagram showing a configuration of a second modification of the semiconductor integrated circuit according to the first embodiment of the present invention.

As shown in FIG. 6, the semiconductor integrated circuit includes an imaging ADC 50 and a counter 60. The imaging ADC 50 has parallel-operating first to N-th ADCs 11, a multi-phase clock signal generating circuit 51 for generating multi-phase clock signals to define the sampling timing of these ADCs 11, and a selector circuit 13 for selecting one of output signals of the ADCs 11. The multi-phase clock signal generating circuit 51, which has a counter 52 therein, generates multi-phase clock signals on the basis of a master clock signal, a phase control number, and a sampling control signal.

The counter 60 generates the sampling control signal on the basis of the master clock signal and a control flag. More specifically, when the control flag is set, the counter 60 counts pulses of master clock signals, generates the sampling control signal at intervals of a predetermined period, and supplies the sampling control signal to the imaging ADC 50.

In the imaging ADC 50, the counter 52 in the multi-phase clock signal generating circuit 51 counts the master clock signal and also stores states for generation of the multi-phase clock signals as counter values. The counter 52, in response to the sampling control signal, changes the counter values by a number set as the phase control number. This causes the multi-phase clock signal generating circuit 51 to change the phases of the multi-phase clock signals.

Figure 7:
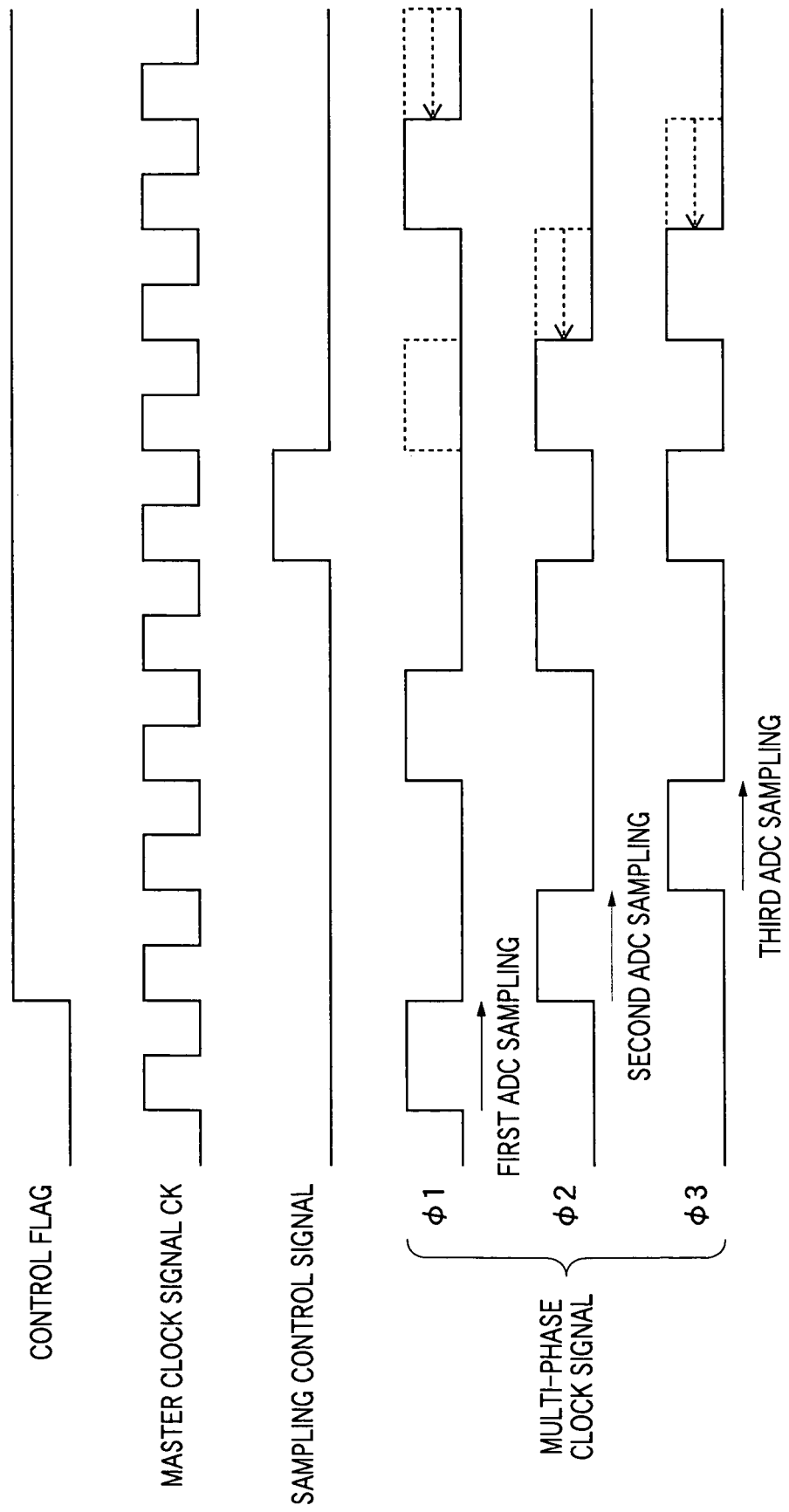
FIG. 7 is a timing chart showing waveforms of signals at various points the an imaging ADC as shown in FIG. 6.

FIG. 7 is a timing chart showing waveforms of signals appearing at various points in the imaging ADC 50 shown in FIG. 6 in the case where N=3. When a control flag is set, the counter 60 counts pulses of the master clock signal CK and changes the sampling control signal to its high level at intervals of a predetermined period. In the imaging ADC 50, when the sampling control signal is changed to high level, the counter 52 in the multi-phase clock signal generating circuit 51 changes its counter values by a number set as the phase control number. As a result, the phases of the multi-phase clock signals Φ1, Φ2 and Φ3 vary as shown in FIG. 7. In FIG. 7, the phase control number is set at "1".

Next, there will be described a second embodiment of the present invention.

Figure 8:
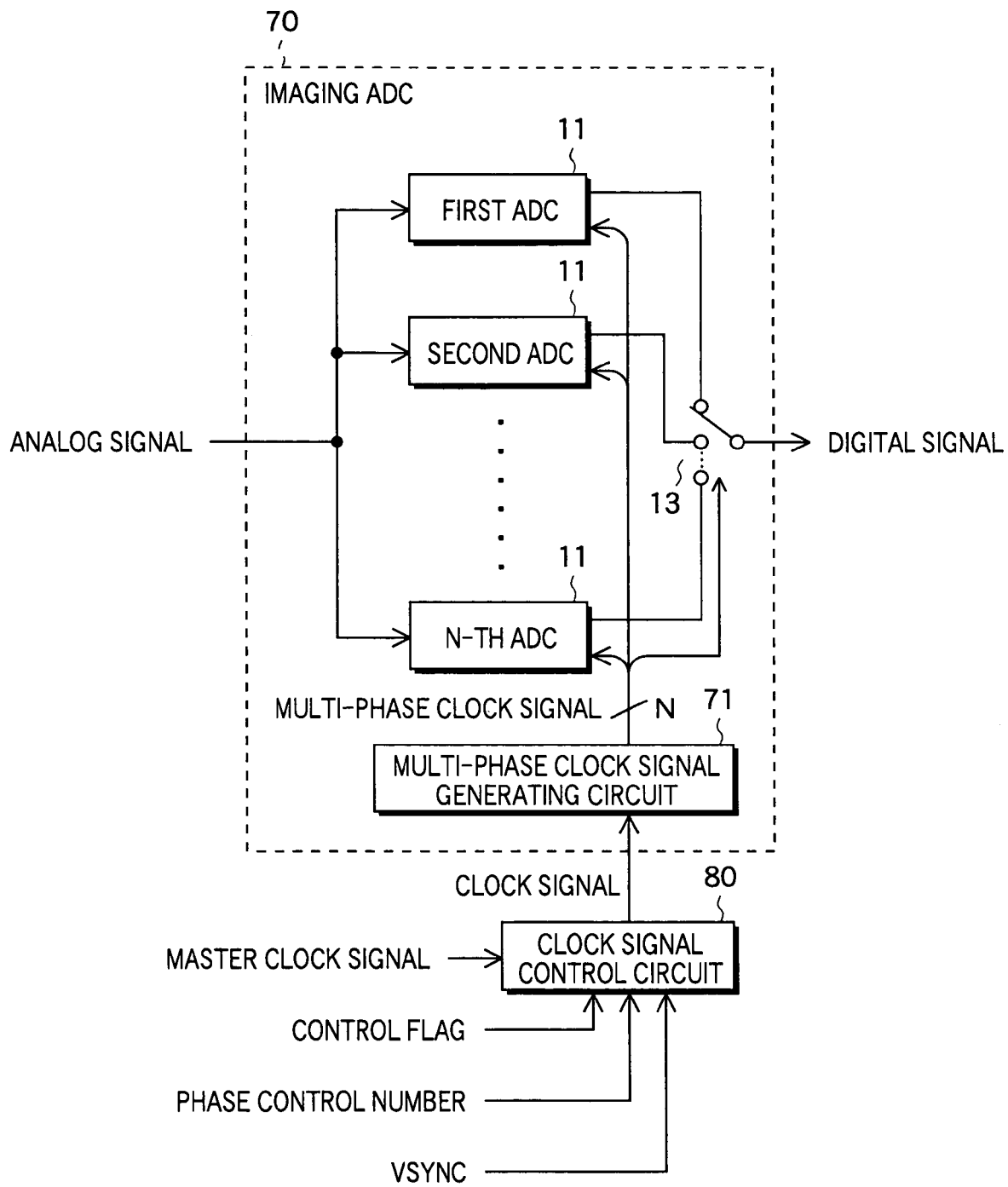
FIG. 8 is a block diagram showing a configuration of a semiconductor integrated circuit according to a second embodiment of the present invention.

FIG. 8 is a block diagram showing a configuration of a semiconductor integrated circuit according to a second embodiment of the present invention. As shown in FIG. 8, the semiconductor integrated circuit includes an imaging ADC 70 and a clock signal control circuit 80. The imaging ADC 70 has a first to N-th ADCs 11 for performing parallel operation, a multi-phase clock signal generating circuit 71 for generating multi-phase clock signals to periodically operate the ADCs 11 in a certain order, and a selector circuit 13 for selecting one of output signals of the ADCs 11.

On the basis of a master clock signal, a control flag, a phase control number and a vertical synchronization signal VSYNC, the clock signal control circuit 80 supplies a clock signal to the multi-phase clock signal generating circuit 71. When the control flag is set, the clock signal control circuit 80 generates from the master clock signal a signal whose pulses are suppressed by a number set as the phase control number, by using the transition edge of the vertical synchronization signal VSYNC as a reference, and supplies the generated signal as the clock signal to the multi-phase clock signal generating circuit 71. In this connection, in place of the vertical synchronization signal VSYNC, a horizontal synchronization signal HSYNC or another signal synchronized with the vertical synchronization signal VSYNC or the horizontal synchronization signal HSYNC may be used.

In the imaging ADC 70, on the basis of the clock signal received from the clock signal control circuit 80, the multi-phase clock signal generating circuit 71 generates multi-phase clock signals to be used for sequentially operating the first to N-th ADCs 11, and supplies the generated multi-phase clock signals to the ADCs 11.

Figure 9:
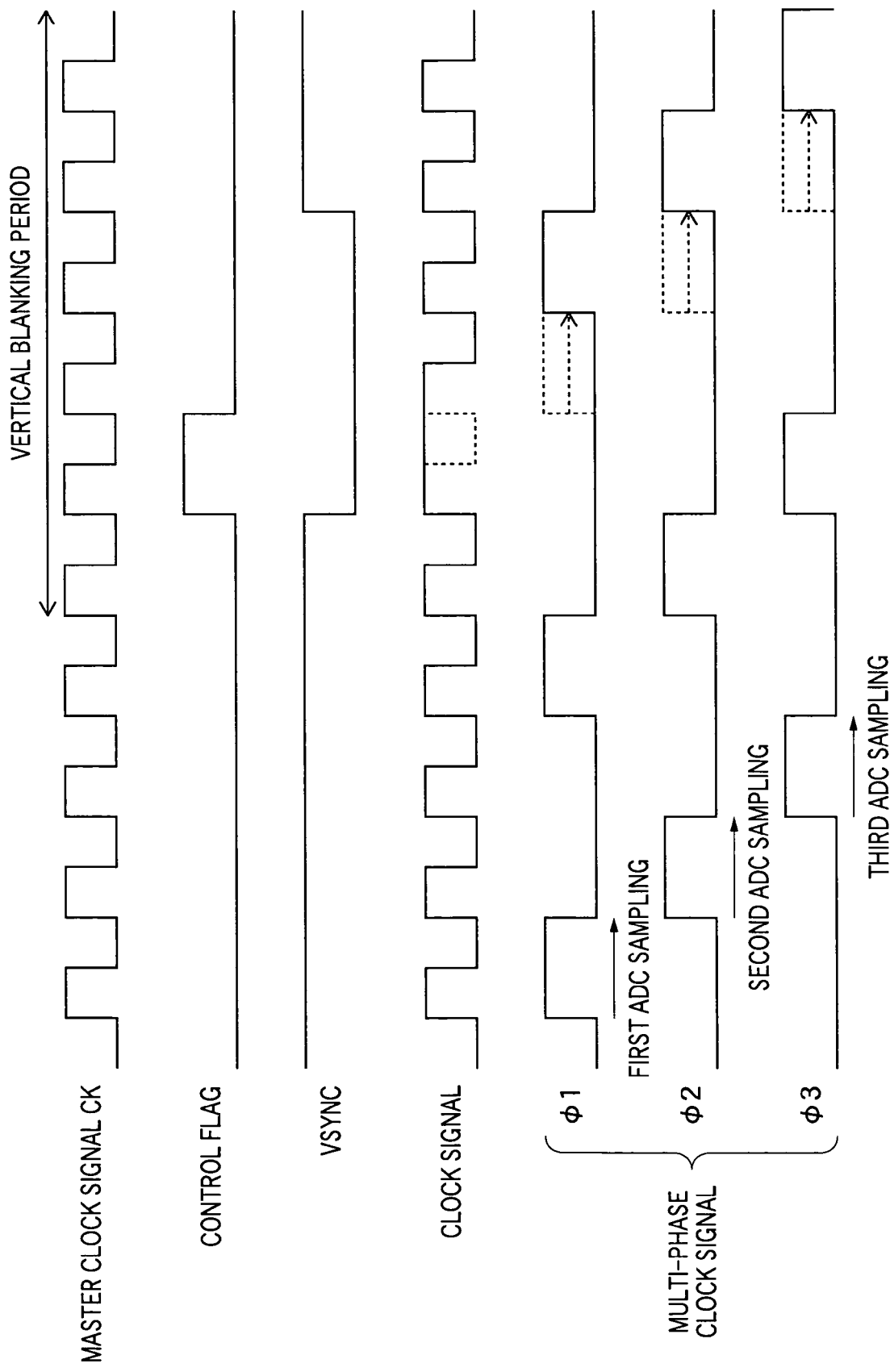
FIG. 9 is a timing chart showing waveforms of signals at various points in an imaging ADC as shown in FIG. 8.

FIG. 9 is a timing chart showing waveforms of signals appearing at various points in the imaging ADC 70 shown in FIG. 8 in the case where N=3. When the control flag is set in the vertical blanking period, the clock signal control circuit 80 generates a signal having pulses obtained by suppressing the pulses of the master clock signal CK by a number set as the phase control number from the transition edge of the vertical synchronization signal VSYNC, and supplies the generated signal as the clock signal to the multi-phase clock signal generating circuit 71 of the imaging ADC 70. When receiving the clock signal, the multi-phase clock signal generating circuit 71 generates multi-phase clock signals Φ1, Φ2 and Φ3 to be used for cyclically operating the first, second, and third ADCs. In FIG. 9, the phase control number is set at "1".

In this manner, irregularities on the screen can be reduced by the averaging effect of the plurality of ADCs for performing parallel operation. However, since a total sampling number is reduced, this operation is required to be carried out in a blanking period during which this operation has no influence upon the screen.

The aforementioned technique is effective not only when a plurality of ADCs are used in parallel for interleave operation, but also when a single ADC is used for converting an analog image signal to a digital image signal while the output signal of the ADC is averaged by sequentially switching (swapping) between a plurality of circuit elements in order to suppress the influences of variations in circuit elements such as a resistor and a capacitor that influence the analog/digital conversion characteristics (including when a plurality of circuit elements form a circuit block). As the circuit block, an amplifier circuit such as a differential amplifier or an operational amplifier can be used. In the case of such a circuit configuration that AD conversion is carried out through a plurality of steps like in a pipeline ADC, a sub-ADC or a sub-DAC corresponds to the circuit block.

Figure 10:
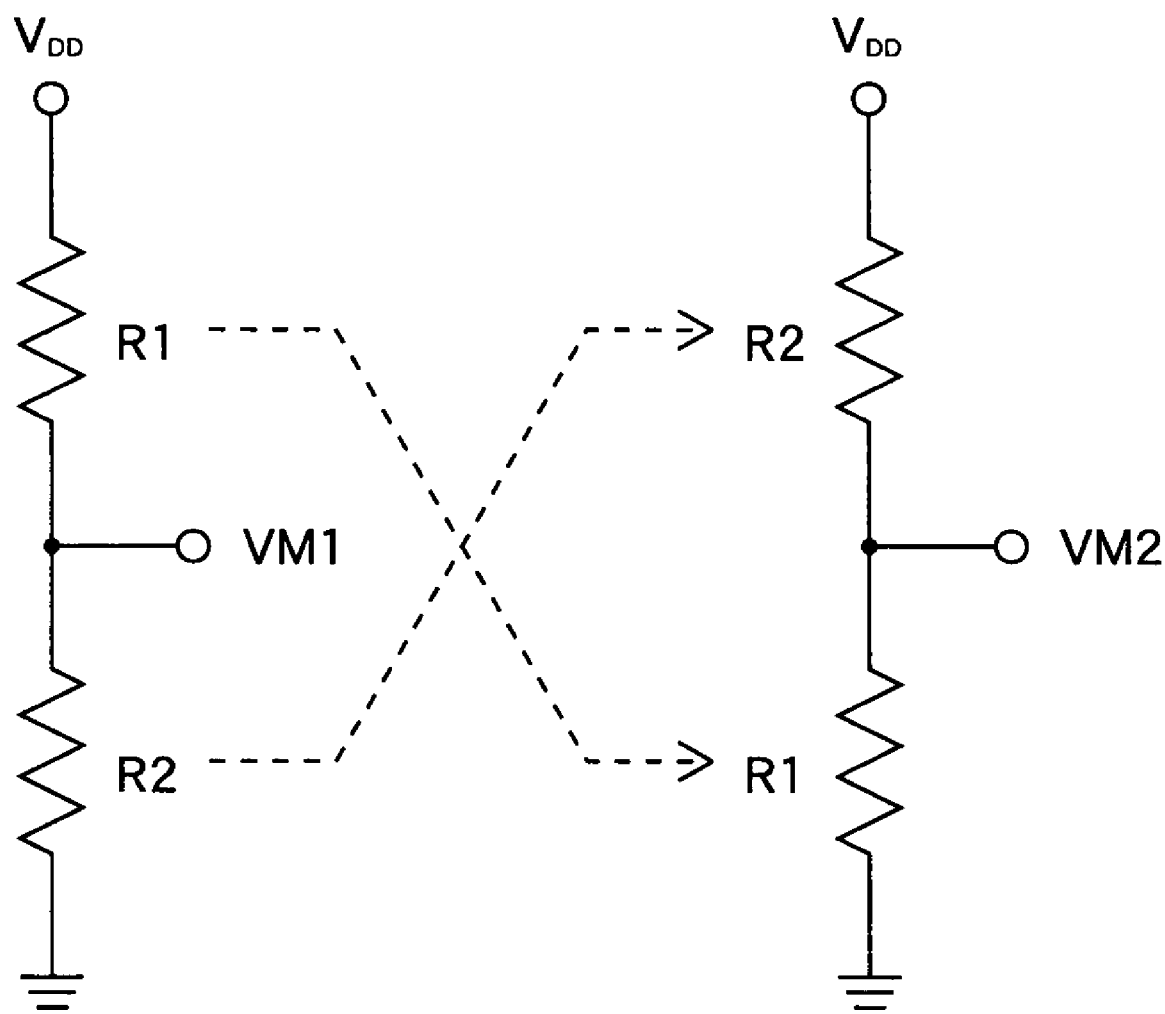
FIG. 10 is a circuit diagram showing the principle of a semiconductor integrated circuit according to a third embodiment of the present invention.

Next, a third embodiment of the present invention using such ADC will be explained. Now, consider the case where a power potential $V_{DD}$ is divided by resistors R1 and R2 whose resistance values are designed to be equal to each other to generate a midpoint potential VM of the power potential $V_{DD}$ as shown in FIG. 10. In this case, it is assumed that a relation R1=R2+ΔR is actually satisfied due to variations in the element formation. When the resistors R1 and R2 are connected as shown in the left side of FIG. 10, a midpoint potential VM1 is expressed by equation (1) as follows:

$$VM1 = V_{DD}\frac{R2}{R1+R2} = V_{DD}\left(\frac{1}{2} - \frac{\Delta R}{2(2R2+\Delta R)}\right) \quad (1)$$

While the positions of the resistors R1 and R2 are reversely connected by switching between the resistors as shown in the right side of FIG. 10, a midpoint potential VM2 is expressed by equation (2) as follows:

$$VM2 = V_{DD}\frac{R1}{R1+R2} = V_{DD}\left(\frac{1}{2} + \frac{\Delta R}{2(2R2+\Delta R)}\right) \quad (2)$$

Accordingly, when the two states are averaged by alternate switching, $V_{DD}/2$ can be accurately generated as the midpoint potential VM.

Figure 11:
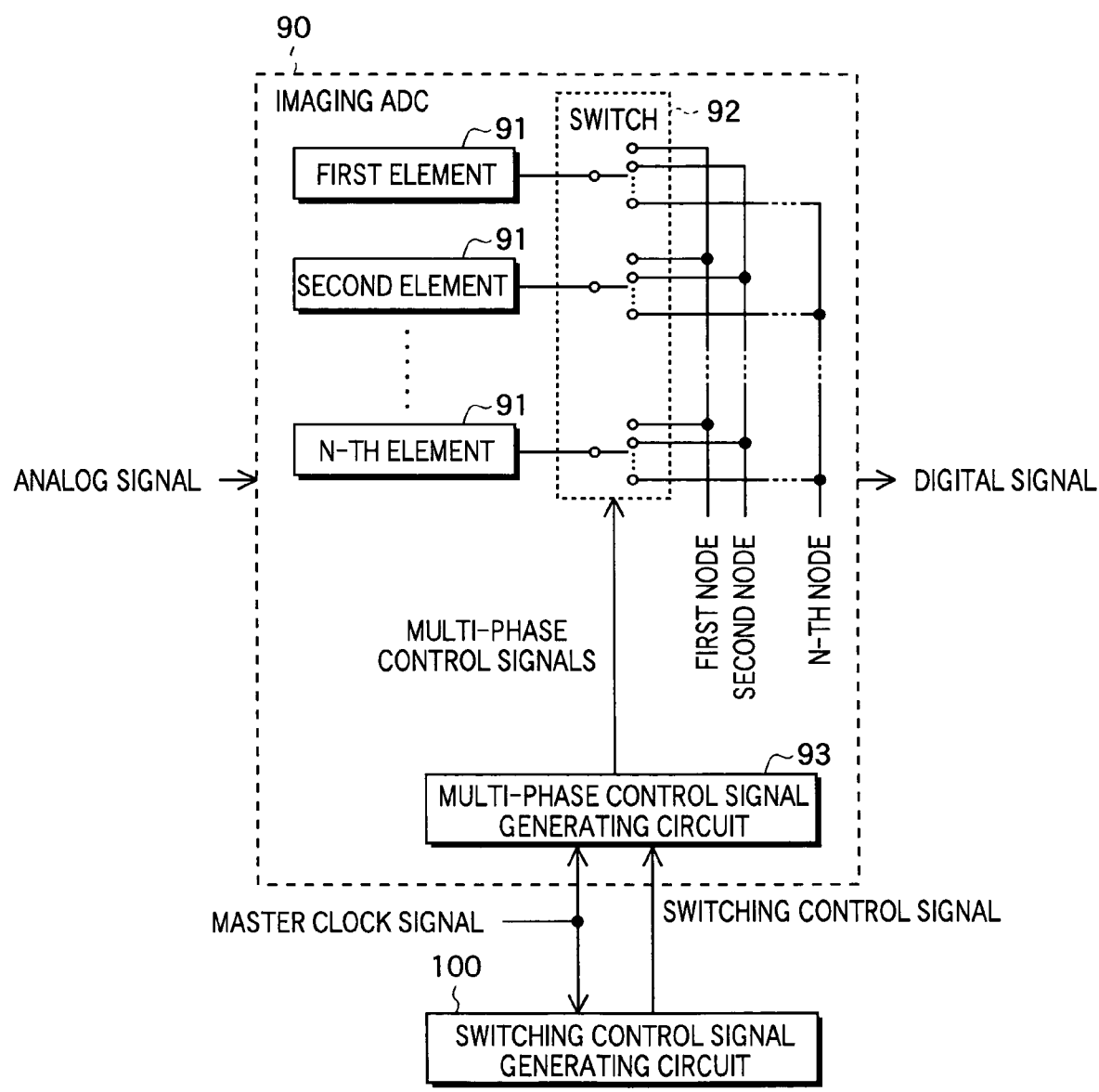
FIG. 11 is a block diagram showing a configuration of the semiconductor integrated circuit according to the third embodiment of the present invention.
Figure 12:
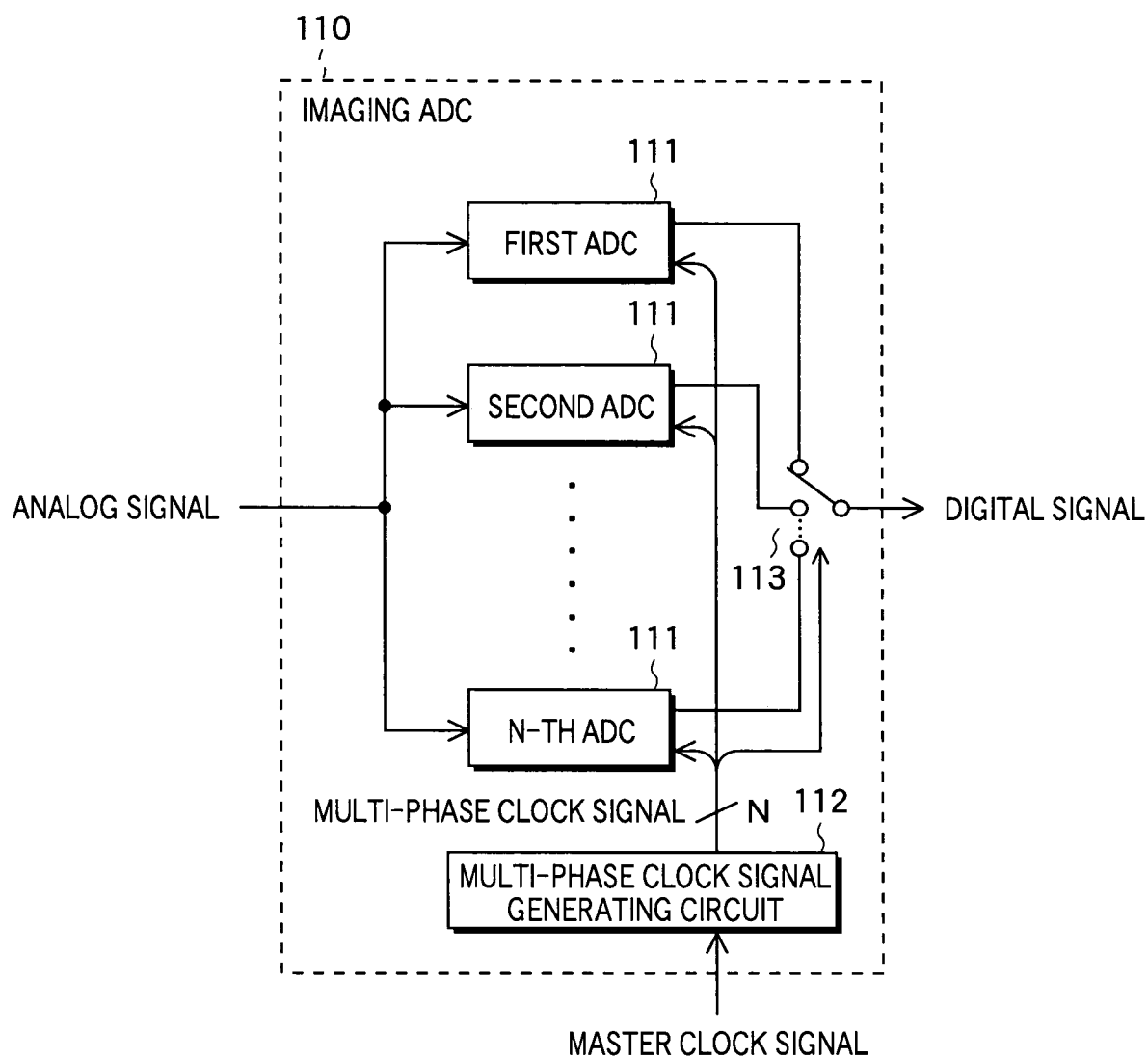
FIG. 12 is a block diagram showing a configuration of a prior art imaging ADC.
Figure 13:
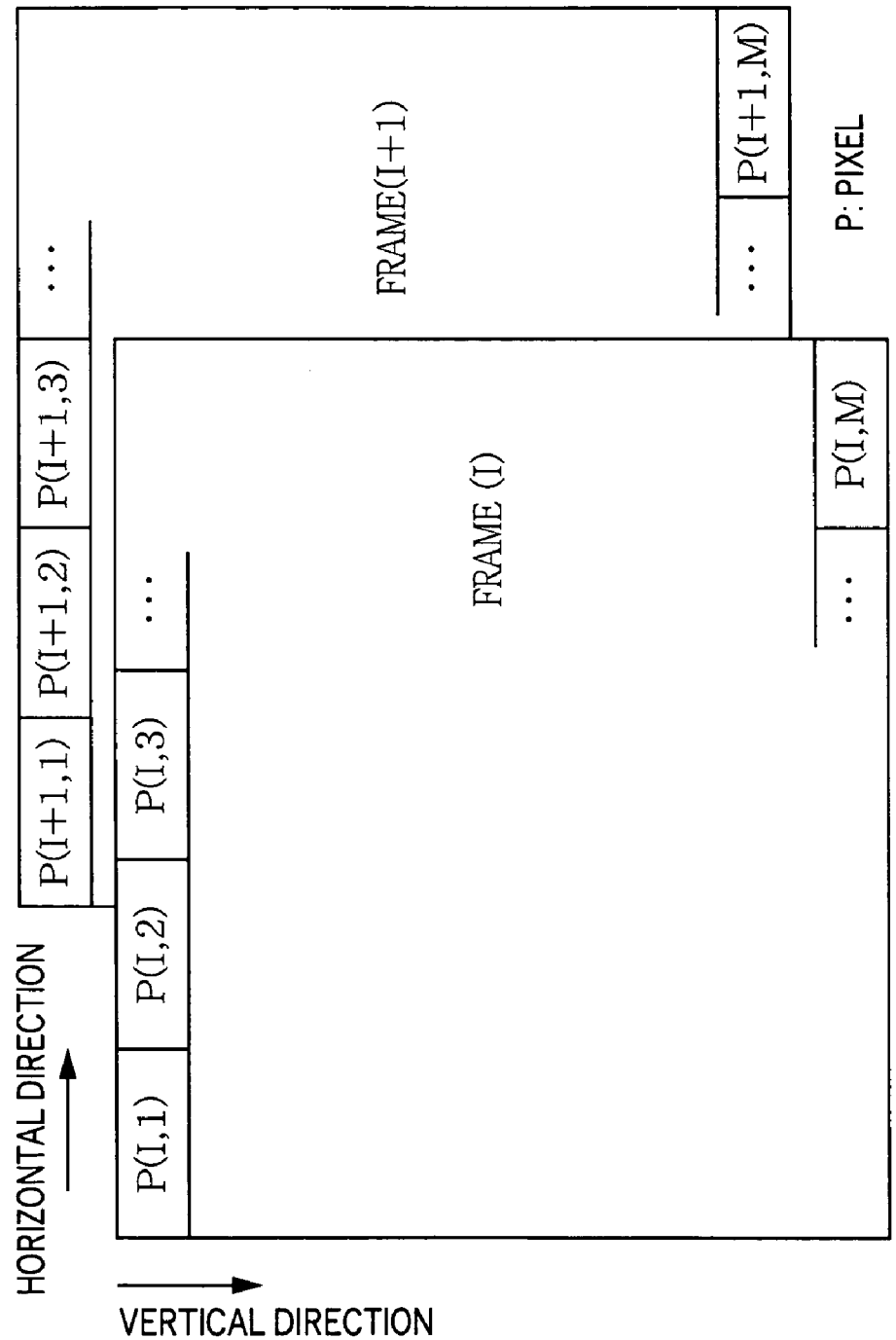
FIG. 13 shows an array of pixels on frames.

FIG. 11 is a block diagram showing a configuration of a semiconductor integrated circuit according to a third embodiment of the present invention.

As shown in FIG. 11, the semiconductor integrated circuit includes an imaging ADC 90 and a switching control signal generating circuit 100. The imaging ADC 90 converts an analog image signal to a digital image signal by sequentially switching between a plurality of circuit elements. FIG. 11 shows the imaging ADC including first to N-th elements 91, and a switch 92 for switching these elements 91 to be connected to the first to N-th node.

The imaging ADC 90 is provided therein with a multi-phase control signal generating circuit 93 which generates multi-phase control signals on the basis of a master clock signal and a sampling control signal received from the switching control signal generating circuit 100. The multi-phase control signals are used for controlling the ADC in such a manner that the first to N-th elements 91 are periodically arranged in a certain order.

In such an imaging ADC, the influences of variations among these elements can be averaged because the switch 92 switches connections between the first to N-th elements 91 and first to N-th nodes. When such a technique is used in the imaging ADC, however, combinations of the elements for performing AD conversion on the same pixel may become the same for a plurality of frames due to the periodicity of the image signal. In such a case, the averaging effect cannot be obtained, and therefore, irregularities appear on the screen. To avoid this, by using a technique similar to that explained in the first and second embodiments of the present invention to control the multi-phase control signal generating circuit 93, the influences of variations in the plurality of elements are averaged and irregularities on the screen are reduced even when the image signal of any specification is inputted.

To this end, the switching control signal generating circuit 100 generates a switching control signal for controlling the multi-phase control signal generating circuit 93 in such a manner that an ADC portion changes the period or an order of arranging the plurality of circuit elements. On the basis of the master clock signal and the sampling control signal received from the switching control signal generating circuit 100, the multi-phase control signal generating circuit 93 changes the phases of the multi-phase control signals. The switch 92 changes connections between the first to N-th elements 91 and the first to N-th ADCs nodes according to the multi-phase control signals. As a result, variations in the first to N-th elements 91 can be randomly averaged and irregularities on the screen can be reduced.

In this case, a technique similar to that explained in the first embodiment of the present invention can be employed as the specific control method. Alternatively, as already explained in the second embodiment of the present invention, the signal whose pulses are restricted by a number set as the phase control number may be generated from the master clock signal, and the generated signal may be supplied as a clock signal to the multi-phase control signal generating circuit 93.

As mentioned above, according to the present invention, there is provided a semiconductor integrated circuit which includes a plurality of interleave-operating ADCs operated in parallel or an imaging ADC for sequentially switching between a plurality of circuit elements, and wherein, even when an image signal of any specification is input, the output signal of the imaging ADC can be averaged and irregularities on the screen can be reduced. More in detail, even when outputs of the plurality of ADCs vary, the screen is re-displayed on the image display device at a rate of several ten cycles per second. Thus, irregularities on the screen can be averaged and can be seen regular to human eye.

As a result, even when an LSI having substantially the same level of fluctuation as in the prior art is employed, the image quality of the imaging ADC can be increased only by a slight addition of circuit. Alternatively, since the influences of variations in the circuit elements can be reduced, the surface area of the circuit elements can be made small compared with the prior art imaging ADC capable of outputting an image having the same level of image quality. As a result, a stray capacitance can be decreased, which realizes high-speed operation.

INDUSTRIAL APPLICABILITY

The present invention can be applied to an image apparatus, a computer or the like which transmits image data and audio data.

The invention claimed is:

1. A semiconductor integrated circuit comprising:
a plurality of analog/digital converting circuits operated in parallel for sequentially converting an analog image signal to a digital image signal;
a multi-phase clock signal generating circuit for generating multi-phase clock signals to be used for periodically operating said plurality of analog/digital converting circuits in a certain order; and
a control circuit for controlling said multi-phase clock signal generating circuit to change at least one of a period and an order of operating said plurality of analog/digital converting circuits in response to at least a synchronization signal which corresponds to the analog image signal.

2. A semiconductor integrated circuit comprising:
a plurality of analog/digital converting circuits operated in parallel for sequentially converting an analog image signal to a digital image signal;
a multi-phase clock signal generating circuit for generating multi-phase clock signals to be used for periodically operating said plurality of analog/digital converting circuits in a certain order; and
a control circuit for controlling said multi-phase clock signal generating circuit to change at least one of a period and an order of operating said plurality of analog/digital converting circuits,
wherein said control circuit controls said multi-phase clock signal generating circuit based on a number of pixels included in one frame of the digital image signal and a number of said plurality of analog/digital converting circuits such that said plurality of analog/digital converting circuits never performs conversion in a same period and in a same order with respect to pixels for at least successive two frames.

3. The semiconductor integrated circuit according to claim 2, wherein said control circuit controls said multi-phase clock signal generating circuit based on the number of pixels included in one frame of the digital image signal and the number of said plurality of analog/digital converting circuits such that said plurality of analog/digital converting circuits never performs conversion in a same period and in a same order with respect to pixels for successive N frames where the number of said plurality of analog/digital converting circuits is N.

4. The semiconductor integrated circuit according to claim 1, wherein said control circuit controls said multi-phase clock signal generating circuit based on an output of a pseudorandom number generating circuit for generating at least N integers where the number of said plurality of analog/digital converting circuits is N so as to shift timing of sampling operation of said plurality of analog/digital converting circuits.

5. A semiconductor integrated circuit comprising:
a plurality of analog/digital converting circuits operated in parallel for sequentially converting an analog image signal to a digital image signal;
a multi-phase clock signal generating circuit for generating multi-phase clock signals to be used for periodically operating said plurality of analog/digital converting circuits in a certain order; and
a control circuit for controlling said multi-phase clock signal generating circuit to change at least one of a period and an order of operating said plurality of analog/digital converting circuits,
wherein said multi-phase clock signal generating circuit counts pulses of a master clock signal and stores counter values to be used for generating the multi-phase clock signals; and
said control circuit controls said multi-phase clock signal generating circuit by changing the counter values stored in said multi-phase clock signal generating circuit at predetermined timing.

6. A semiconductor integrated circuit comprising:
a plurality of analog/digital converting circuits operated in parallel for sequentially converting an analog image signal to a digital image signal;
a multi-phase clock signal generating circuit for generating multi-phase clock signals to be used for periodically operating said plurality of analog/digital converting circuits in a certain order; and a control circuit for controlling said multi-phase clock signal generating circuit to change at least one of a period and an order of operating said plurality of analog/digital converting circuits, wherein said multi-phase clock signal generating circuit counts pulses of a master clock signal and stores counter values to be used for generating the multi-phase clock signals; and said control circuit controls said multi-phase clock signal generating circuit by changing the counter values stored in said multi-phase clock signal generating circuit at predetermined timing based on a counter value obtained by counting the pulses of the master clock signal.

7. A semiconductor integrated circuit comprising:

a plurality of analog/digital converting circuits operated in parallel for sequentially converting an analog image signal to a digital image signal;

a multi-phase clock signal generating circuit for generating multi-phase clock signals to be used for periodically operating said plurality of analog/digital converting circuits in a certain order; and a control circuit for controlling said multi-phase clock signal generating circuit to change at least one of a period and an order of operating said plurality of analog/digital converting circuits, wherein said control circuit outputs a clock signal obtained by suppressing a predetermined number of pulses included in a master clock signal; and said multi-phase clock signal generating circuit generates said multi-phase clock signals based on counter values obtained by counting pulses of the clock signal outputted from said control circuit.

8. The semiconductor integrated circuit according to claim 7, wherein said control circuit outputs the clock signal obtained by suppressing the predetermined number of pluses included in the master clock signal in a blanking period of the digital image signal.

9. A semiconductor integrated circuit comprising:

an analog/digital converting circuit for converting an analog image signal to a digital image signal by sequentially switching between a plurality of circuit elements;

a first control circuit for controlling said analog/digital converting circuit to periodically arrange said plurality of circuit elements in a certain order; and a second control circuit for controlling said first control circuit to change at least one of a period and an order of arranging said plurality of circuit elements in response to at least a synchronization signal which corresponds to the analog image signal.

10. A semiconductor integrated circuit comprising:

an analog/digital converting circuit for converting an analog image signal to a digital image signal by seciuentiallv switching between a plurality of circuit elements;

a first control circuit for controlling said analog/digital converting circuit to periodically arrange said plurality of circuit elements in a certain order; and a second control circuit for controlling said first control circuit to change at least one of a period and an order of arranging said plurality of circuit elements, wherein said second control circuit controls said first control circuit based on a number of pixels included in one frame of the digital image signal and a number of said plurality of circuit elements such that said analog/digital converting circuit never arranges said plurality of circuit elements in a same period and in a same order with respect to pixels for at least successive two frames.

11. A semiconductor integrated circuit comprising:

an analog/digital converting circuit for converting an analog image signal to a digital image signal by sequentially switching between a plurality of circuit elements;

a first control circuit for controlling said analog/digital converting circuit to periodically arrange said plurality of circuit elements in a certain order; and a second control circuit for controlling said first control circuit to change at least one of a period and an order of arranging said plurality of circuit elements, wherein said second control circuit controls said first control circuit based on the number of pixels included in one frame of the digital image signal and the number of said plurality of circuit elements such that said analog/digital converting circuit never arranges said plurality of circuit elements in the same period and in the same order with respect to pixels for successive N frames where a number of said circuit elements is N.

12. A semiconductor integrated circuit comprising:

an analog/digital converting circuit for converting an analog image signal to a digital image signal by sequentially switching between a plurality of circuit elements;

a first control circuit for controlling said analog/digital converting circuit to periodically arrange said plurality of circuit elements in a certain order; and a second control circuit for controlling said first control circuit to change at least one of a period and an order of arranging said plurality of circuit elements, wherein said first control circuit counts a master clock signal and stores counter values to be used for generating multi-phase control signals for controlling said analog/digital converting circuit; and said second control circuit controls said first control circuit by changing the counter values stored in said first control circuit at predetermined timing.

13. A semiconductor integrated circuit comprising:

an analog/digital converting circuit for converting an analog image signal to a digital image signal by sequentially switching between a plurality of circuit elements;

a first control circuit for controlling said analog/digital converting circuit to periodically arrange said plurality of circuit elements in a certain order; and a second control circuit for controlling said first control circuit to change at least one of a period and an order of arranging said plurality of circuit elements, wherein said first control circuit counts a master clock signal and stores counter values to be used for generating multi-phase control signals for controlling said analog/digital converting circuit; and said second control circuit controls said first control circuit by changing the counter values stored in said first control circuit at a predetermined interval based on a counter value obtained by counting a master clock signal.

14. A semiconductor integrated circuit comprising:

an analog/digital converting circuit for converting an analog image signal to a digital image signal by sequentially switching between a plurality of circuit elements;

a first control circuit for controlling said analog/digital converting circuit to periodically arrange said plurality of circuit elements in a certain order; and a second control circuit for controlling said first control circuit to change at least one of a period and an order of arranging said plurality of circuit elements, wherein said second control circuit outputs a clock signal obtained by suppressing a predetermined number of pulses included in a master clock signal; and said first control circuit generates multi-phase control signals for controlling said analog/digital converting circuit based on counter values obtained by counting the clock signal outputted from said second control circuit.

15. The semiconductor integrated circuit according to claim 13, wherein said second control circuit outputs the clock signal obtained by suppressing the predetermined number of pulses included in the master clock signal in a blanking period of the digital image signals.

* * * * *

UNITED STATES PATENT AND TRADEMARK OFFICE
CERTIFICATE OF CORRECTION

PATENT NO. : 7,049,994 B2  
APPLICATION NO. : 10/508795  
DATED : May 23, 2006  
INVENTOR(S) : Tatsuo Tsujita It is certified that error appears in the above-identified patent and that said Letters Patent is hereby corrected as shown below:

Col. 11, Line 54 and 55, claim 10, lines 3 ans 4, please correct the word "seciuentiallv" to --sequentially--

Signed and Sealed this

Twenty-first Day of November, 2006

JON W. DUDAS  
*Director of the United States Patent and Trademark Office*